(12) United States Patent
Chou et al.

(10) Patent No.: US 8,114,709 B2
(45) Date of Patent: Feb. 14, 2012

(54) ELECTRONIC DEVICE AND LEAD FRAME

(75) Inventors: Peter Chou, Taipei (TW); Lucy Tian, Tianjin (CN); Bear Zhang, Tianjin (CN)

(73) Assignee: Vishay General Semiconductor LLC

( * ) Notice: Subject to any disclaimer, the term of this patent is extended or adjusted under 35 U.S.C. 154(b) by 91 days.

(21) Appl. No.: 12/774,812

(22) Filed: May 6, 2010

(65) Prior Publication Data

US 2010/0216283 A1    Aug. 26, 2010

Related U.S. Application Data

(62) Division of application No. 11/544,836, filed on Oct. 6, 2006, now Pat. No. 7,741,703.

(51) Int. Cl.
*H01L 21/50*    (2006.01)
*H05K 3/32*    (2006.01)
*H05K 3/34*    (2006.01)

(52) U.S. Cl. ........ 438/111; 257/666; 257/676; 257/690; 257/E21.499; 257/E25.016; 438/106; 438/123

(58) Field of Classification Search .................. 257/666, 257/676, 690, 762, E21.499, E25.016; 438/106, 438/111, 123
See application file for complete search history.

(56) References Cited

U.S. PATENT DOCUMENTS

| 3,497,947 A | 3/1970 | Ardezzone |
| 6,404,066 B1 | 6/2002 | Tsuji et al. |
| 2001/0014487 A1* | 8/2001 | Guillot .......................... 438/106 |

* cited by examiner

*Primary Examiner* — Hung Vu
*Assistant Examiner* — Vernon P Webb
(74) *Attorney, Agent, or Firm* — Mayer & Williams PC; Karin L. Williams

(57) ABSTRACT

A lead frame facilitates the handling, positioning, attachment, and/or continued integrity of multiple dies, without the use of multiple separate parts, such as jumpers. The lead frame includes a number of structures, each of which is attached to at least one lead. At least one receiving surface, arranged to receive a die, is associated with each structure. When dies are disposed on the receiving surfaces, anodes are similarly-oriented. A number of fingers are attached to the lead frame, and one or more electrode contact surfaces are attached to each finger. Each electrode contact surface can be positioned (for example, bent) with respect to one receiving surface, to facilitate electrical connection between the anode of a die and a lead. The lead frame may be used in connection with surface- and through-hole-mountable electronic devices, such as bridge rectifier modules.

9 Claims, 8 Drawing Sheets

ELECTRONIC DEVICE AND LEAD FRAME

RELATED APPLICATIONS

This application is a divisional application of co-pending U.S. patent application Ser. No. 11/544,836, filed Oct. 6, 2006, which is incorporated by reference in its entirety herein.

BACKGROUND

One type of electronic device is a module. A module includes, among other things, one or more dies (also referred to as chips), which may be semiconductor dies or other types of dies. Modules may be analog, digital, or a combination of analog and digital. An example of an analog module is a bridge rectifier. Several bridge rectifier modules are available from Vishay Intertechnology, Inc.

FIG. 1A is a simplified diagram of a typical bridge rectifier circuit. As shown, four rectifier dies are connected to each other by electrically conducting members. A positive DC (+) output terminal is connected to the cathode (N-type contact of die) of two of the rectifiers, while the negative DC (−) output terminal is connected to the anode (P-type contact of die) of two of the rectifiers. The two AC (~) input terminals are each connected to an anode of one rectifier and the cathode of another rectifier. FIG. 1B is a cross section of a rectifier die that is used in bridge rectifier modules. The rectifier die is a single crystal semiconductor where the anode side is referred to as p-type and the cathode side is referred to as n-type. The surfaces of both sides of the die have thin metal layers that act as electrically conducting contacts. There is also a passivation layer (such as glass or $SiO_2$) that protects the junction. A concern is if a large metal contact is in contact with the passivation later it may cause the passivation layer to crack because of differences in thermal expansion when the module heats up during normal operation.

Module packaging generally includes an exterior housing that protects the dies associated with the module. An example of an exterior housing is an epoxy housing. A number of leads, generally two or more leads, extend from the housing. The leads facilitate electrical interconnection between the electrodes of the dies and electronic components external to the module. The leads are configured to allow the module to be mounted to a substrate using various techniques, such as through-hole-mounting or surface-mounting techniques.

The leads extending from the housing are connected to the electrodes of the dies within the housing using various techniques. A lead frame is a type of packaging that can be used to provide such connection(s). Designing a lead frame that facilitates the efficient and reliable handling, positioning, and attachment of multiple dies is desirable. For example, it often desirable to use automated processes to concurrently load and attach multiple dies onto a lead frame. It is also often desirable to monitor the quality of the attachment (made by soldering, for example) between the lead frame and the electrodes of the dies.

Some existing lead frame designs reduce the throughput and/or increase the cost of producing modules, especially when automated loading and attachment processes are used. Generally, bridge rectifier modules are constructed with either two similar lead frames or a single lead frame with separate metal jumpers between the dies and portions of the lead frame. For example, one lead frame design requires electrodes of dies to be oriented in different directions. In general, only similarly oriented dies are concurrently loadable using automation—when the dies are differently oriented, automated loading efficiency is reduced. Manual loading is generally less efficient than automated loading. In addition, when dies are oriented in different directions, disparate stresses on die passivation may occur. This is sometimes referred to as the "sandwich effect". The sandwich effect may cause quality or reliability problems.

Another type of lead frame is composed of more than one piece or more than one lead frame. For example, die pad structures may be designed having two or more pieces, and/or separate jumper structures may be used to connect the electrodes of the dies to the leads. In one example, when four rectifier dies are placed between two lead frames, two of the dies have the p-type (anode) contact facing upwards and the other two dies have the n-type (cathode) contact facing upwards. In another example, all four dies have their anodes facing upwards. The anode of each die is connected with a small metal jumper to the appropriate portion of the lead frame. Since the metal jumpers are small, they are difficult to handle for automated soldering equipment. Also, these jumpers may shift during the soldering process and contact the passivation layers of the dies, resulting in reliability problems. Also, additional solder joints are used between each jumper and the lead frame, which may adversely affect the power-handling capability of the device, because solder has a higher thermal resistance than copper. When lead frames have more than one piece, the likelihood of part positioning errors (and subsequent reliability problems) is increased. Part positioning errors can lead to reliability and production problems, including soldering problems, which result in increased costs and reduced throughput. Having die surfaces hidden from view may make inspection difficult.

It will be appreciated that the claimed subject matter is not limited to implementations that solve any or all of the disadvantages of specific lead frames or aspects thereof.

SUMMARY

Aspects of surface- and through-hole-mountable electronic devices, such as bridge rectifier modules, are discussed herein. In particular, apparatuses for mounting a number of dies, and methods for manufacturing electronic devices that use the apparatuses, are disclosed. In one implementation, an apparatus includes a lead frame. The lead frame facilitates the handling, positioning, attachment, and/or continued integrity of multiple dies, without the use of multiple separate parts.

The lead frame includes a number of structures, each of which is attached to at least one lead. At least one receiving surface, arranged to receive a die, is associated with each structure. A receiving surface may be attached to or formed on a structure, for example. When dies are disposed on the receiving surfaces, anodes of the dies are oriented in the same direction.

The apparatus further includes a number of fingers (each of which may be composed of one or more segments) and a number of electrode contact surfaces. Each finger has two ends, which, depending on the segment structure of the finger, may be contiguous or non-contiguous. One end of each finger is attached to the lead frame. One or more electrode contact surfaces are attached to the other end. Each electrode contact surface can be positioned with respect to one receiving surface, to facilitate electrical connection between the anode of a die and a lead. A finger may be bendable at the attached end, for example, to superpose an electrode contact surface over a receiving surface. The electrode contact surface may be attached to the anode via a bonding process, such as soldering. When the surface area of an electrode contact surface is less than the surface area of a semiconductor device, solder joints are inspectable for quality assurance.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter.

DETAILED DESCRIPTION

Figure 1A:
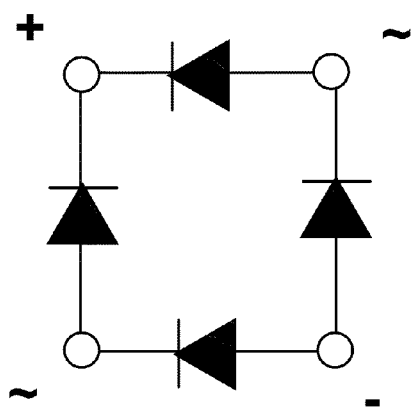
FIG. 1A is a simplified diagram of a typical bridge rectifier circuit.
Figure 1B:
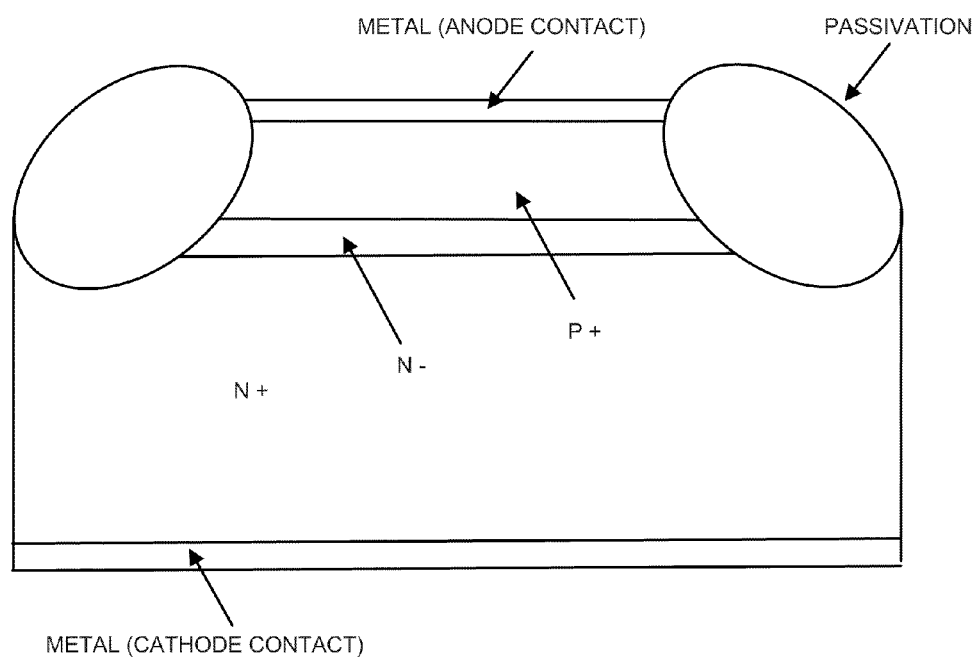
FIG. 1B is a cross section of a rectifier die that is used in bridge rectifier modules.
Figure 2:
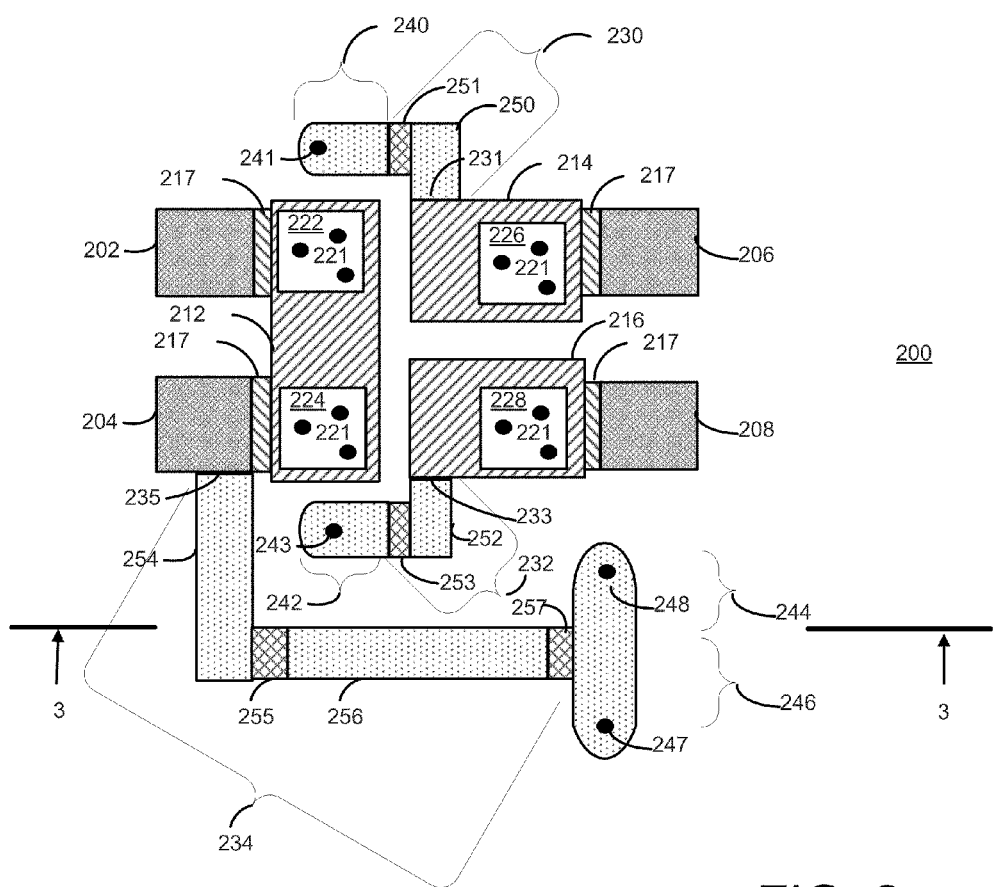
FIG. 2 is a top view of an outline of an apparatus, which includes an integral lead frame, for mounting a plurality of dies.

Turning to the drawings, where like numerals represent like components, FIG. 2 is a top view of an outline of an apparatus 200 for mounting a plurality of dies (not shown). For exemplary purposes, each die discussed herein is assumed to have the same basic configuration as illustrated in FIG. 1B. As such, each die includes a base material, which may be a semiconductor material or another type of material, and at least two electrodes, an anode and a cathode, which are used to make electrical contact with one or more circuits on the die.

Referring again to FIG. 2, elements of apparatus 200 are briefly introduced, and the elements are discussed in further detail below. Apparatus 200 includes leads 202, 204, 206, and 208. Optional housing attachment regions 217 form part of each lead.

Apparatus 200 also includes structures 212, 214, and 216, each of which is attached to at least one lead 202, 204, 206, or 208. As shown, structure 212 is integral with leads 202 and 204; structure 214 is integral with lead 206; and structure 216 is integral with lead 208. Together, the leads and structures form a lead frame.

The apparatus further includes a number of receiving surfaces 222, 224, 226, and 228, each of which is arranged to receive a die. At least one receiving surface is associated with each structure 212, 214, and 216. As shown, receiving surfaces 222 and 224 are associated with structure 212; receiving surface 226 is associated with structure 214; and receiving surface 228 is associated with structure 216.

Still further, apparatus 200 includes a number of fingers 230, 232, and 234, which are attached to the lead frame. Each finger meets either a particular lead or a particular structure at one end of the finger. As shown, finger 230 meets and is integral with structure 214 at bendable region 231; finger 232 meets and is integral with structure 216 at bendable region 233; and finger 234 meets and is integral with lead 204 at bendable region 235.

A second end of each finger has at least one electrode contact surface attached thereto. As shown, electrode contact surface 240 is attached to and is integral with finger 230; electrode contact surface 242 is attached to and integral with finger 232; and electrode contact surfaces 244 and 246 are attached to and integral with finger 234. Each electrode contact surface is positionable with respect to one receiving surface via bending of a finger at a bendable region. Electrode contact surfaces 240, 242, 244, and 246 have optional attachment areas or surfaces 241, 243, 248, and 247, respectively, attached thereto or integral therewith.

In the discussion herein, it will be appreciated that various configurations of leads, structures, receiving surfaces, fingers and electrode contact surfaces may be used, and that the distinction between such elements is generally functional and/or logical, rather than purely structural.

Referring in more detail to leads 202, 204, 206, and 208, the leads are arranged to extend from a package (not shown) that includes a housing (not shown) within which dies are disposed. The leads facilitate electrical interconnection between electrodes of the dies and external electronic components (not shown) in well-known manners. In one implementation, the leads are arranged to allow the device to be mounted to a substrate using through-hole-mounting or surface-mounting techniques. As shown, the leads are arranged so the device can be surface-mounted. As shown, lead 202 is an anode lead, lead 204 is a cathode lead, and leads 206 and 208 are alternating current ("AC") leads. Any arrangement of leads now known or later developed is possible, however. The leads are generally composed in whole or in part of a conductive material, such as copper.

Optional housing attachment regions 217 are places at which the housing may be received by (for example, attached to) the lead frame. As shown, housing attachment regions 217 are vertical segments (with respect to the leads) formed at places where leads 202, 204, 206, and/or 208 are integral with structures 212, 214, and/or 216. In alternative implementations, housing attachment regions 217 may be located elsewhere and/or may have different configurations.

Referring to structures 212, 214, and 216 in more detail, the structures are substantially flat surfaces arranged in a particular pattern of organization and attached to one or more leads. As shown, structure 212 is integral with leads 202 and 204; structure 214 is integral with lead 206, and structure 216 is integral with lead 208. The structures are generally composed in whole or in part of a conductive material, such as copper. The number, surface characteristics, pattern of organization, materials, and method(s) for attachment of the structures are implementation-specific details that may be determined on a device-by-device basis.

Receiving surfaces 222, 224, 226 and 228 are attached to structures 212, 214, and 216. In one implementation, receiving surfaces are formed on, or integrally with, the structures, although other attachment techniques are possible. The receiving surfaces are generally composed in whole or in part of a conductive material, such as copper.

As shown, receiving surfaces 222 and 224 are formed on structure 212; receiving surface 226 is formed on structure 214; and receiving surface 228 is formed on structure 216. Each receiving surface is arranged to receive one die in such a manner that the anode of the die does not meet the receiving surface. In one implementation, the anode is opposed to the receiving surface. In the context of apparatus 200, one die is disposable on each receiving surface with the anode facing upwards and the cathode in contact with receiving surface/die pads 221 (dies are shown on receiving surfaces in connection with FIG. 4). Die pads 221 facilitate electrical interconnection between the lead frame and a die in accordance with well-known manners and techniques. Die pads 221 may be any desired geometric shape. Die pads 221 having circular/spherical geometries are shown. Die pads 221 may be integral with receiving surfaces 222, 224, 226, and 228 (and/or associated structures 212, 214, and 216), or may be attached thereto. Die pads 221 are generally composed in whole or in part of a conductive material, such as copper.

It will be understood that receiving surfaces 222, 224, 226 and 228 represent all or part of the areas depicted (for exemplary purposes as squares) in FIG. 2. For example, a particular receiving surface may be deemed to be the entire area on a particular structure that is occupied by a die. Alternatively, a particular receiving surface may be deemed to be only one or more die pads 221. In a further alternative, a particular receiving surface may be any combination of all or part of such areas.

Referring to fingers 230, 232, and 234 in more detail, each finger may be formed in whole or in part of any desired material, such as copper, and may include one or more straight or non-straight (for example, curved), integral or attached segments. The segments (discussed further below) may be in any desired configuration(s) or orientation(s) with respect to the lead frame and/or each other. Each finger is bendable in at least one location. As shown, finger 230 is bendable at bendable region 231, finger 232 is bendable at bendable regions 233, and finger 234 is bendable at bendable region 235. It will be appreciated that bendable regions may be located in different places on the fingers than are illustrated herein.

In the context of apparatus 200, finger 230 is formed of two substantially straight integral segments 250 and 251. Segment 251 is only partially visible in FIG. 2, and is shown (in a bent configuration) in more detail in FIG. 6, which is discussed further below. In an unbent configuration, segment 250 has an end that is co-planar and integral with structure 214 at bendable region 231. Segment 250 extends at a right angle from, and is co-planar with, one side of structure 214. Segment 251 extends, at one end, at an (obtuse) angle from segment 250 in an upward direction. Electrode contact surface 240 is attached at (as shown, formed integrally with) the other end of segment 251, and formed in a plane parallel to a plane associated with the lead frame—more specifically, in a plane parallel to the plane of structure 212.

Finger 232 is also formed of two substantially straight integral segments 252 and 253. Segment 253 is only partially visible, and is shown (in a bent configuration) in more detail in FIG. 8, which is discussed further below. In an unbent configuration, segment 252 has an end that is co-planar and integral with structure 216 at bendable region 233. Segment 252 extends at a right angle from, and is co-planar with, one side of structure 216. Segment 253 extends, at one end, at an (obtuse) angle from segment 252 in an upward direction. Electrode contact surface 242 is attached at (as shown, formed integrally with) the other end of segment 253, in a plane parallel to a plane associated with the lead frame—more specifically, in a plane parallel to the plane of structure 212.

Finger 234 is formed of four integral segments 254, 255, 256, and 257. Segments 255 and 257 are only partially visible in FIG. 2, and are shown in more detail in FIG. 3 (in an unbent configuration) and FIG. 7 (in a bent configuration). Segment 254 is L-shaped and, in an unbent configuration, has an end that is co-planar and integral with lead 204 at bendable region 235. Segment 254 extends at a right angle from one side of lead 204.

Figure 3:
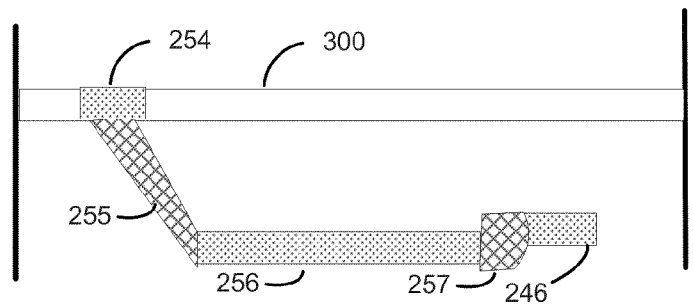
FIG. 3 is a side view, in the direction of arrows 3-3, of a portion of the apparatus shown in FIG. 2

Segment 255 is illustrated, in an unbent configuration, in FIG. 3, which is a side view of finger 234 shown in FIG. 2, in the direction of arrows 3-3. As shown in FIG. 3, with reference to plane 300 of lead 204 (shown in FIG. 2), segment 255 is partially curved, and extends, at one end, at an acute angle from segment 254 in a downward direction. Segment 256 extends, at one end, from segment 255 in a plane parallel to plane 300. Segment 257 extends, at one end, at an (obtuse) angle from the other end of segment 256 in an upward direction. Electrode contact surfaces 244 and 246 (only 246 is visible in FIG. 3) are attached at (as shown, formed integrally with) the other end of segment 257, and formed in a plane parallel to a plane 300—more specifically, in a plane parallel to the plane of structure 214 and/or 216 (structures 214 and 216 are shown in FIG. 2).

Referring again to FIG. 2, electrode contact surfaces 240, 242, 244 and 246 are discussed in further detail. Electrode contact surfaces 240, 242, 244, and 246 represent all or part of elements referred to as being attached to fingers 230, 232, and 234. For example, the electrode contact surfaces may be considered to be those surfaces (that may be integral with the fingers), which are formed in planes associated with the lead frame. Alternatively, the electrode contact surfaces may themselves be areas or surfaces integral with, or attached to, such surfaces. Examples of such areas or surfaces are areas/surfaces 241, 243, 248, and 247, which are shown as circles/spheres, but which may assume any desired geometrical configurations. The electrode contact surfaces are generally composed in whole or in part of a conductive material, such as copper.

Each electrode contact surface is positionable, either manually or using automation, with respect to one receiving surface. As shown, electrode contact surface 240 is positionable with respect to receiving surface 222 via bending of finger 230 at bendable region 231. Electrode contact surface 242 is positionable with respect to receiving surface 224 via bending of finger 232 at bendable region 233. Electrode contact surface 244 is positionable with respect to receiving surface 228 via bending of finger 234 at bendable region 235. Electrode contact surface 246 is positionable with respect to receiving surface 226 via bending of finger 234 at bendable region 235.

Figure 4:
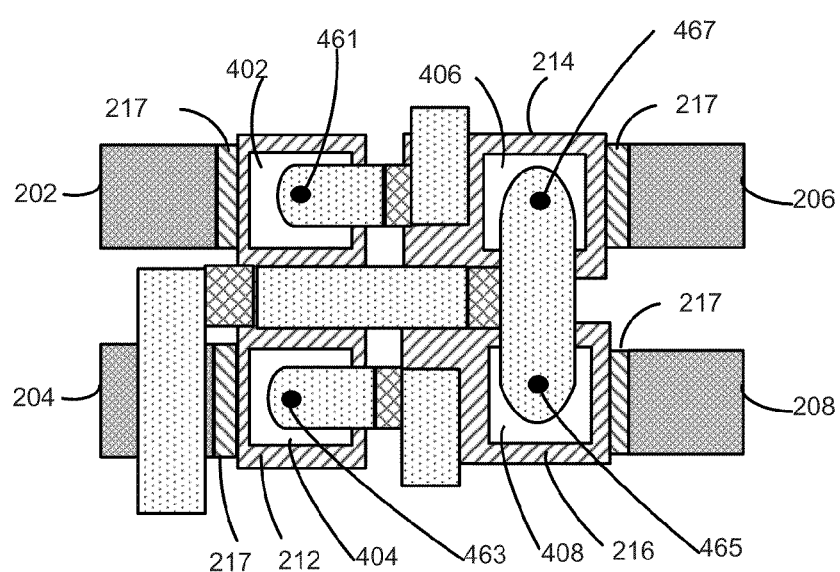
FIG. 4 is top view of the apparatus shown in FIG. 2, after the electrode contact surfaces have been positioned with respect to the receiving surfaces.

FIG. 4 is top view of the apparatus shown in FIG. 2, after electrode contact surfaces 240, 242, 244, and 246 have been positioned with respect to receiving surfaces 222, 224, 226, and 228 (the receiving surfaces are not visible in FIG. 4), respectively. As shown, dies 402, 404, 406, and 408, each configured like the die shown in FIG. 1B, having anodes (not visible) and cathodes (not visible), are disposed on the receiving surfaces, in such a manner that the anodes of the dies do not meet (for example, are opposed to) the receiving surfaces. Contacts 461, 463, 465, and 467 are shown.

Figure 5:
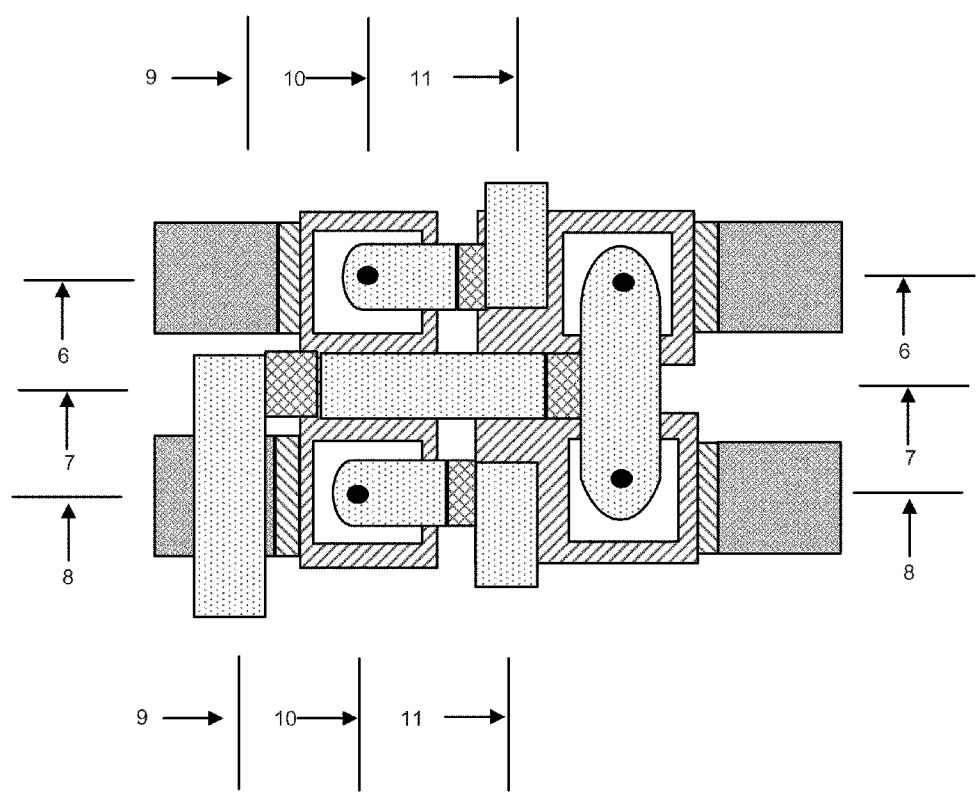
FIG. 5 is the top view shown in FIG. 4, further illustrating the directions of arrows 6-6, 7-7, 8-8, 9-9, 10-10, and 11-11, on which the cross-sectional views depicted in FIGS. 6-11 are based.

From the perspective of the top view shown in FIG. 4, FIG. 5 illustrates the directions of arrows 6-6, 7-7, 8-8, 9-9, 10-10, and 11-11, on which the cross-sectional views depicted in FIGS. 6-11 are based.

Figure 6:
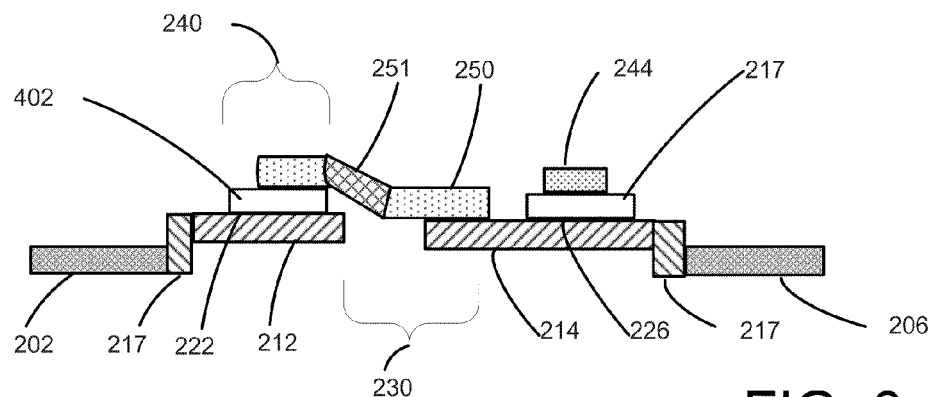
FIG. 6 is a cross-sectional view, in the direction of arrows 6-6, of the apparatus shown in FIG. 5.
Figure 7:
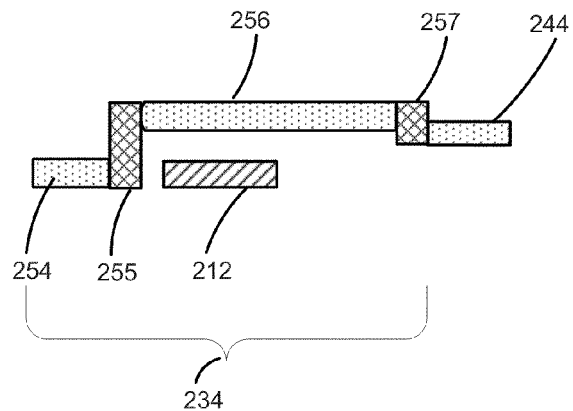
FIG. 7 is a cross-sectional view, in the direction of arrows 7-7, of the apparatus shown in FIG. 5.

FIG. 6 is a cross-sectional view, in the direction of arrows 6-6, of the apparatus shown in FIG. 5. In one aspect, FIG. 6 illustrates finger 230 (composed of segments 250 and 251) in a bent position. When finger 230 is bent at bendable region 231 (not visible; shown in FIG. 2), segment 250 is in contact with structure 214, and electrode contact surface 240 is superposed over receiving surface 222 and over die 402. In another aspect, FIG. 6 illustrates the superposition of electrode contact surface 246 over receiving surface 226, when die 406 is disposed on receiving surface 226. Electrode contact surface 246 is positionable by bending finger 234 (not visible) at bendable region 235 (not visible). FIG. 7, which is a cross-sectional view of the apparatus shown in FIG. 5, illustrates finger 234 (composed of segments 254, 255, 256, and 257) in a bent position.

Figure 8:
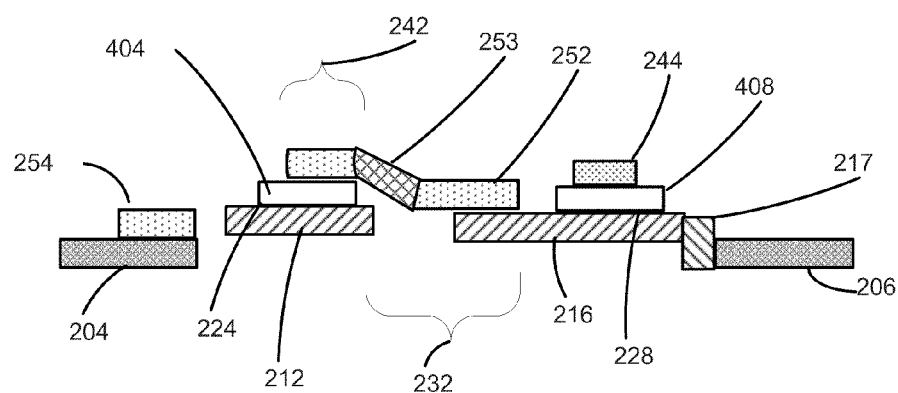
FIG. 8 is a cross-sectional view, in the direction of arrows 8-8, of the apparatus shown in FIG. 5.

FIG. 8 is a cross-sectional view, in the direction of arrows 8-8, of the apparatus shown in FIG. 5. In one aspect, FIG. 8 illustrates how segment 254 of finger 234 (shown in FIG. 7) meets lead 204 when finger 234 is in a bent position. In another aspect, FIG. 8 illustrates finger 232 (composed of segments 252 and 253) in a bent position. When finger 232 is bent at bendable region 233 (not visible; shown in FIG. 2), segment 252 is in contact with structure 216, and electrode contact surface 242 is superposed over receiving surface 224 and over die 404. In yet another aspect, FIG. 8 illustrates the superposition of electrode contact surface 244 over receiving surface 228, when die 408 is disposed on receiving surface 228.

Figure 9:
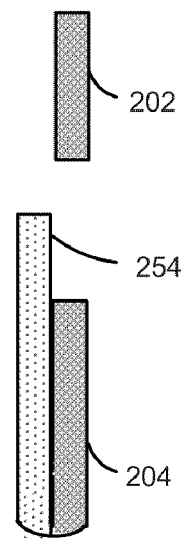
FIG. 9 is a cross-sectional view, in the direction of arrows 9-9, of the apparatus shown in FIG. 5.

FIG. 9 is a cross-sectional view, in the direction of arrows 9-9, of the apparatus shown in FIG. 5. FIG. 9 illustrates in another view how segment 254 of finger 234 (shown in FIG. 7) meets lead 204 when finger 234 is in a bent position.

Figure 10:
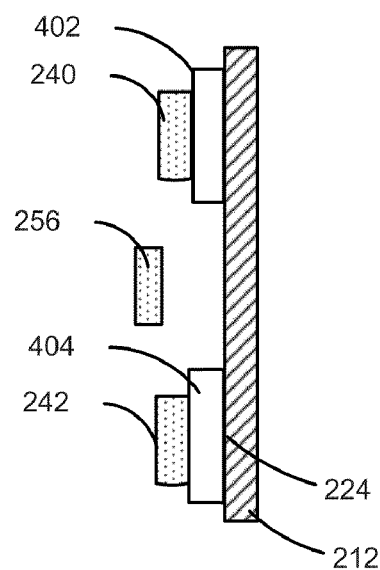
FIG. 10 is a cross-sectional view, in the direction of arrows 10-10, of the apparatus shown in FIG. 5.

FIG. 10 is a cross-sectional view, in the direction of arrows 10-10, of the apparatus shown in FIG. 5. In one aspect, FIG. 10 illustrates the superposition of electrode contact surface 240 over receiving surface 222, when die 402 is disposed on receiving surface 222. In another aspect, FIG. 10 illustrates the superposition of electrode contact surface 242 over receiving surface 224, when die 404 is disposed on receiving surface 224. FIG. 10 further illustrates segment 256 of finger 234 (shown in FIG. 7), when finger 234 is bent at bendable region 235 (not visible; shown in FIG. 2).

Figure 11:
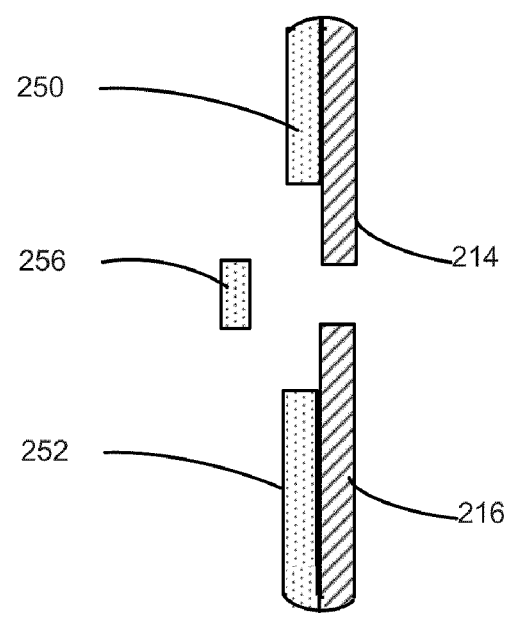
FIG. 11 is a cross-sectional view, in the direction of arrows 11-11, of the apparatus shown in FIG. 5.

FIG. 11 is a cross-sectional view, in the direction of arrows 11-11, of the apparatus shown in FIG. 5. In one aspect, FIG. 11 illustrates how segment 250 of finger 230 (shown in FIG. 6) meets structure 214 when finger 230 is in a bent position. In another aspect, FIG. 11 illustrates how segment 252 of finger 232 (shown in FIG. 8) meets structure 216 when finger 232 is in a bent position. FIG. 11 further illustrates segment 256 of finger 243 (shown in FIG. 7), when finger 234 is bent at bendable region 235 (shown in FIG. 2).

Figure 12:
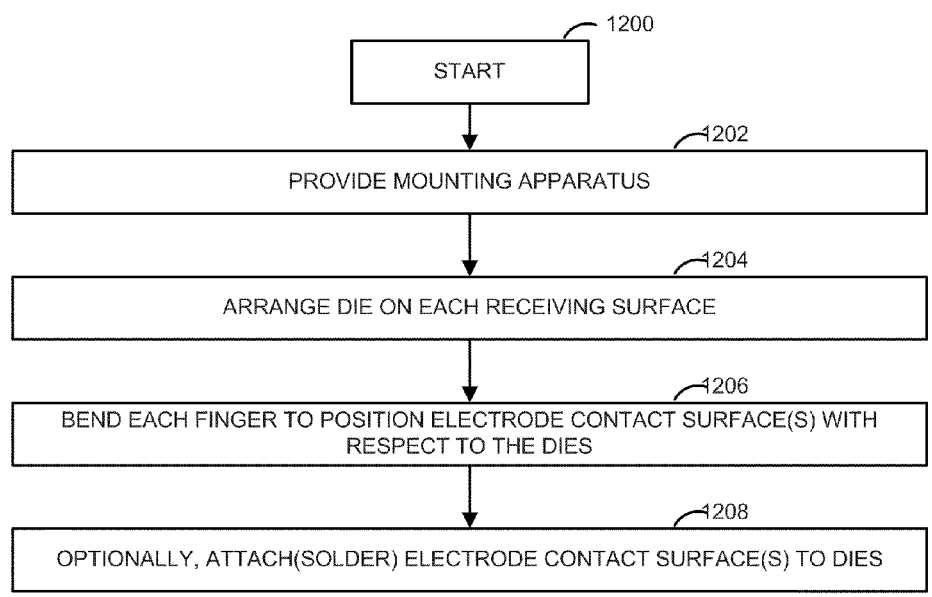
FIG. 12 is a flowchart of a method for manufacturing an electronic device that includes the apparatus shown in FIG. 2.

FIG. 12 is a flowchart of a method for manufacturing an electronic device that includes the apparatus, referred to as a mounting apparatus, shown in FIG. 2. The process(es) illustrated in FIG. 12 may be implemented (in whole or in part) using one or more general, multi-purpose, or single-purpose processors. Unless specifically stated, the methods described herein are not constrained to a particular order or sequence. In addition, some of the described method(s) or elements thereof can occur or be performed concurrently.

The method begins at oval 1200, and continues at block 1202, where the mounting apparatus is provided.

In one sample manner of constructing the apparatus shown in FIG. 2, multiple lead frames are produced as a single sub-assembly (in an array, for example). Each lead frame is connected to the sub-assembly at one or more points via leads 202, 204, 206, and/or 208. Each of structures 212, 214, and 216 is integrally formed with at least one lead. Bendable regions 231, 233, and 235 may be formed in any desired manner, such as by stamping, cutting, or another method.

At block 1204, a die is arranged on each receiving surface, with the anode of each die not meeting the receiving surface.

In one implementation, dies 402 and 404 may be placed at the same time on structure 212, on receiving surfaces 222 and 224, respectively. Next, die 408 is placed on structure 216, on receiving surface 228, and finally die 406 is placed on structure 214, on receiving surface 226. Anodes of each die are facing upward, the receiving surfaces. Other positions, orientations, and orders of assembly are possible, however.

Next, at block 1206, each finger is bent, to position one or more electrode contact surfaces with respect to the arranged dies. In one sample implementation, fingers 230, 232, and 234 are bent at bendable regions 231, 233, and 235, respectively. In a bent position, electrode contact surface 240 is superposed over receiving surface 222 and the anode of die 402, electrode contact surface 242 is superposed over receiving surface 224 and the anode of die 404, electrode contact surface 244 is superposed over receiving surface 228 and the anode of die 408, and electrode contact surface 246 is superposed over receiving surface 226 and the anode of die 406. In one exemplary implementation, the surface areas of the electrode contact surfaces are smaller than the surface areas of the dies over which they are superposed.

The electrode contact surface(s) may optionally be attached (by soldering, for example), to the dies, as indicated at block 1208. When the surface areas of the electrode contact surfaces are smaller than the surface areas of the dies, it is possible to inspect the attachments (for example, the solder joints) between the dies and the electrode contact surfaces. For example, solder joints may be visually or electronically inspected for quality assurance purposes. It will be appreciated that dies may also be attached to the receiving surfaces, either in addition to or instead of attachment to electrode contact surfaces.

Thus, a lead frame apparatus for mounting a number of dies, and methods for manufacturing electronic devices that use the lead frame, have been disclosed. The lead frame facilitates the handling, positioning, attachment, and/or continued integrity of multiple dies, without the use of multiple separate parts, such as separate jumpers. For example, the lead frame can be used with automated die positioning and soldering processes, because its lack of separate parts makes it accurately positionable. Automated equipment may be used to fold bendable regions over to make contact to dies, which may have solder paste applied thereto prior to the folding. Since the fingers are an integral part of the single lead frame, there is no shifting during the soldering process—the "folded frame" technique herein described facilitates near perfect alignment. In addition, there are no additional solder joints associated with separate jumpers, and the piece part count is reduced. Also, when dies are disposed on the lead frame, their anode electrodes are oriented in the same direction, so two or more dies can be loaded concurrently, increasing assembly throughput. The copper composition of the lead frame results in high material utilization and generally low cost. Also, copper improves the thermal dissipation capability of lead frame. The "sandwich effect" is mitigated by the orientation of the dies, which reduces reliability problems and increases quality. Having electrode contact surfaces with surface areas smaller than surface areas of the dies provides the ability to inspect soldering performance, which reduces yield loss and costs.

Although the subject matter herein has been described in language specific to structural features and/or methodological acts, it is also to be understood that the subject matter defined in the claims is not necessarily limited to the specific features or acts described above. Rather, the specific features and acts described above are disclosed as example forms of implementing the claims.

The word "exemplary" is used herein to mean serving as an example, instance, or illustration. Any implementation or aspect thereof described herein as "exemplary" is not necessarily to be construed as preferred or advantageous over other implementations or aspects thereof.

As it is understood that embodiments other than the specific embodiments described above may be devised without departing from the spirit and scope of the appended claims, it is intended that the scope of the subject matter herein will be governed by the following claims.

The invention claimed is:

1. A method of manufacturing an electronic device, the method comprising:
   providing a mounting apparatus, the mounting apparatus comprising:
   a plurality of leads,
   a plurality of structures, each structure attached to at least one lead, the structures and the leads forming a lead frame,
   a plurality of receiving surfaces, at least one receiving surface associated with each structure, each receiving surface arranged to receive a die,
   a plurality of fingers, each finger having a first end and a second end, and having at least a first bendable portion and a second bendable portion, the first end of each finger being the first bendable portion and being attached to the lead frame; and
   a plurality of electrode contact surfaces, at least one electrode contact surface attached to the second end of each finger;
   arranging a die on each receiving surface in such a manner that an anode of the die does not meet the receiving surface; and
   bending each finger at the first bendable portion attached to the lead frame and the second bendable portion to position the at least one electrode contact surface attached to the second end of each finger with respect to an arranged die to allow the electrode contact surface to make contact with respect to one receiving surface in such a manner that when a die is disposed on the receiving surface, the electrode contact surface facilitates electrical connection between the anode of the die and one of the plurality of leads.

2. The method according to claim 1, wherein the step of bending comprises superposing the at least one electrode contact surface over the arranged die.

3. The method according to claim 1, further comprising:
   attaching each electrode contact surface to the anode of each arranged die in such a manner that each electrode contact surface facilitates electrical connection between the anode of the die and one of the plurality of leads.

4. The method according to claim 3, wherein the step of attaching comprises soldering.

5. The method according to claim 1, wherein the electronic device comprises a surface-mountable device.

6. The method according to claim 1, wherein the electronic device comprises a through-hole mountable device.

7. The method according to claim 1, wherein a number of receiving surfaces comprises at least three.

8. The method according to claim 1, wherein the step of arranging comprises arranging a die on each receiving surface in such a manner that an anode of the die is opposed to the receiving surface.

9. A method of mounting a plurality of diodes, each diode having an anode, the method comprising:
   providing a mounting apparatus, the mounting apparatus comprising:
   a plurality of leads;
   a plurality of structures, each structure integral with at least one lead, the structures and the leads forming a lead frame;
   a plurality of receiving surfaces, at least one receiving surface associated with and formed on each structure, each receiving surface arranged to receive a die in such a manner that when the die is disposed on the receiving surface the anode does not meet the receiving surface;
   a plurality of fingers, each finger having a first end and a second end, the first end of each finger integral with the lead frame, and having at least a first bendable portion and a second bendable portion, the first bendable portion located where the first end of the finger is integral with the lead frame; and
   at least one electrode contact surface attached to the second end of each finger, each electrode contact surface bendably positionable with respect to one associated receiving surface via bending of the finger at the first bendable portion at the first end integral with the lead frame, and via the second bendable portion, and
   maintaining said first and second bendable portions in an unbent position such that each electrode contact surface is not superposed over the associated receiving surface, to facilitate disposing the die on the associated receiving surface; and
   arranging a die on each receiving surface in such a manner that an anode of the die does not meet the receiving surface.

* * * * *